(12) United States Patent
Jung et al.

(10) Patent No.: US 10,938,090 B2
(45) Date of Patent: Mar. 2, 2021

(54) ANTENNA MODULE

(71) Applicant: SAMSUNG ELECTRONICS CO., LTD., Suwon-si (KR)

(72) Inventors: Hyung Mi Jung, Suwon-si (KR); Seong Hyun Yoo, Suwon-si (KR); Ji Hye Shim, Suwon-si (KR); Ki Seok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 16/287,056

(22) Filed: Feb. 27, 2019

(65) Prior Publication Data
US 2020/0014090 A1 Jan. 9, 2020

(30) Foreign Application Priority Data
Jul. 3, 2018 (KR) .................. 10-2018-0076939

(51) Int. Cl.
*G06K 19/06* (2006.01)
*H01Q 1/22* (2006.01)
*H01Q 1/24* (2006.01)
*G06K 19/077* (2006.01)
*H01L 23/66* (2006.01)

(52) U.S. Cl.
CPC ..... *H01Q 1/2283* (2013.01); *G06K 19/07749* (2013.01); *H01L 23/66* (2013.01); *H01Q 1/243* (2013.01); *H01L 2223/6677* (2013.01); *H01L 2224/48227* (2013.01)

(58) Field of Classification Search
CPC .......... H01Q 1/2283; H01Q 1/243; G06K 19/07749; H01L 23/66; H01L 2223/6677; H01L 2224/48227

USPC .................. 235/492, 487, 488
See application file for complete search history.

(56) References Cited

U.S. PATENT DOCUMENTS

| | | | |
|---|---|---|---|
| 8,256,685 B2 | 9/2012 | Chen et al. | |
| 9,178,281 B2 | 11/2015 | Kasai | |
| 9,941,226 B2 | 4/2018 | Tsai et al. | |
| 2011/0315774 A1 | 12/2011 | Baba et al. | |
| 2012/0056796 A1 | 3/2012 | Kato et al. | |
| 2012/0217305 A1* | 8/2012 | Yamazaki | G06K 19/07747 235/488 |

(Continued)

FOREIGN PATENT DOCUMENTS

| | | |
|---|---|---|
| CN | 102298722 A | 12/2011 |
| CN | 103026551 A | 4/2013 |

(Continued)

OTHER PUBLICATIONS

Communication dated Jan. 22, 2020 by the Taiwan Intellectual Property Office in counterpart Taiwan Patent Application No. 108106204.

(Continued)

*Primary Examiner* — Karl D Frech
(74) *Attorney, Agent, or Firm* — Sughrue Mion, PLLC

(57) ABSTRACT

An antenna module includes: a base substrate including a rigid region and a flexible region; an antenna member disposed on one surface of the rigid region of the base substrate and including antenna patterns; and a semiconductor package disposed on the other surface of the rigid region of the base substrate and including one or more semiconductor chips.

20 Claims, 11 Drawing Sheets

(56) References Cited

U.S. PATENT DOCUMENTS

| | | |
|---|---|---|
| 2013/0112754 A1 | 5/2013 | Ikemoto |
| 2015/0115038 A1* | 4/2015 | Kuschewski ...... G06K 19/0775 235/488 |
| 2017/0287796 A1 | 10/2017 | Lee et al. |
| 2017/0338542 A1 | 11/2017 | Cok |
| 2018/0019216 A1 | 1/2018 | Hashemi et al. |
| 2018/0053732 A1 | 2/2018 | Baek et al. |
| 2018/0145033 A1 | 5/2018 | Yi et al. |
| 2019/0081013 A1 | 3/2019 | Chen et al. |

FOREIGN PATENT DOCUMENTS

| | | |
|---|---|---|
| CN | 104303195 A | 1/2015 |
| CN | 107978593 A | 5/2018 |
| JP | 5545371 B2 | 5/2014 |
| KR | 10-2014-0002542 A | 1/2014 |
| KR | 10-2018-0058095 A | 5/2018 |
| TW | 201413901 A | 4/2014 |
| TW | 201622076 A | 6/2016 |
| TW | 201740487 A | 11/2017 |
| TW | 201801286 A | 1/2018 |
| TW | 201807793 A | 3/2018 |
| WO | 2010/131524 A1 | 11/2010 |

OTHER PUBLICATIONS

Communication dated Apr. 29, 2019, issued by the Korean Intellectual Property Office in counterpart Korean Application No. 10-2018-0076939.

Communication dated Sep. 1, 2020, issued by the State Intellectual Property Office of P.R. China in counterpart Chinese Application No. 201910370081.7.

"RFID", Science & Technology Information, No. 29, 2007, China Academic Journal Electronic Publishing House, p. 35 (2 pages).

* cited by examiner

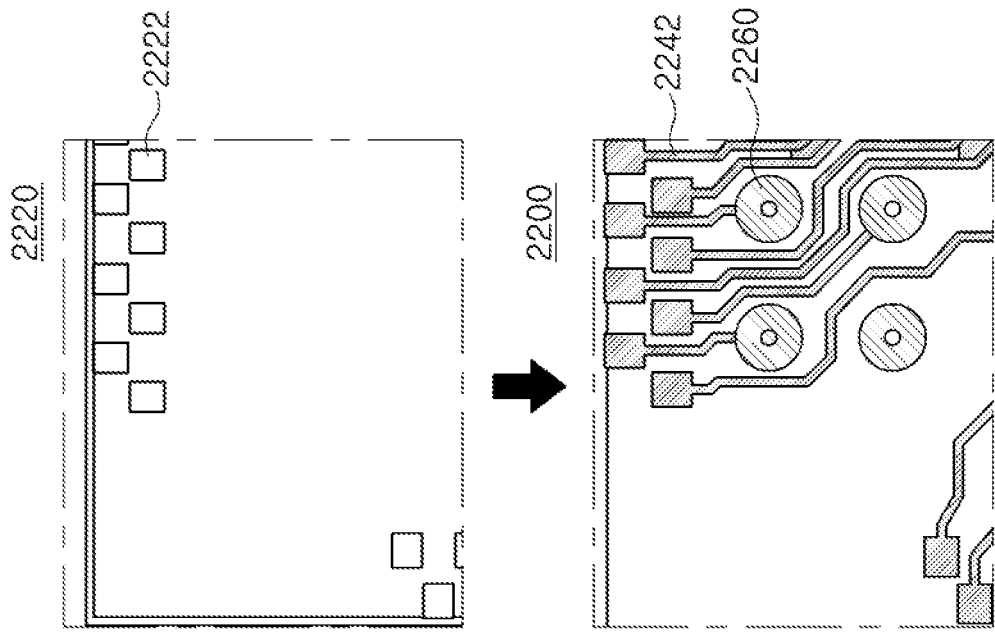
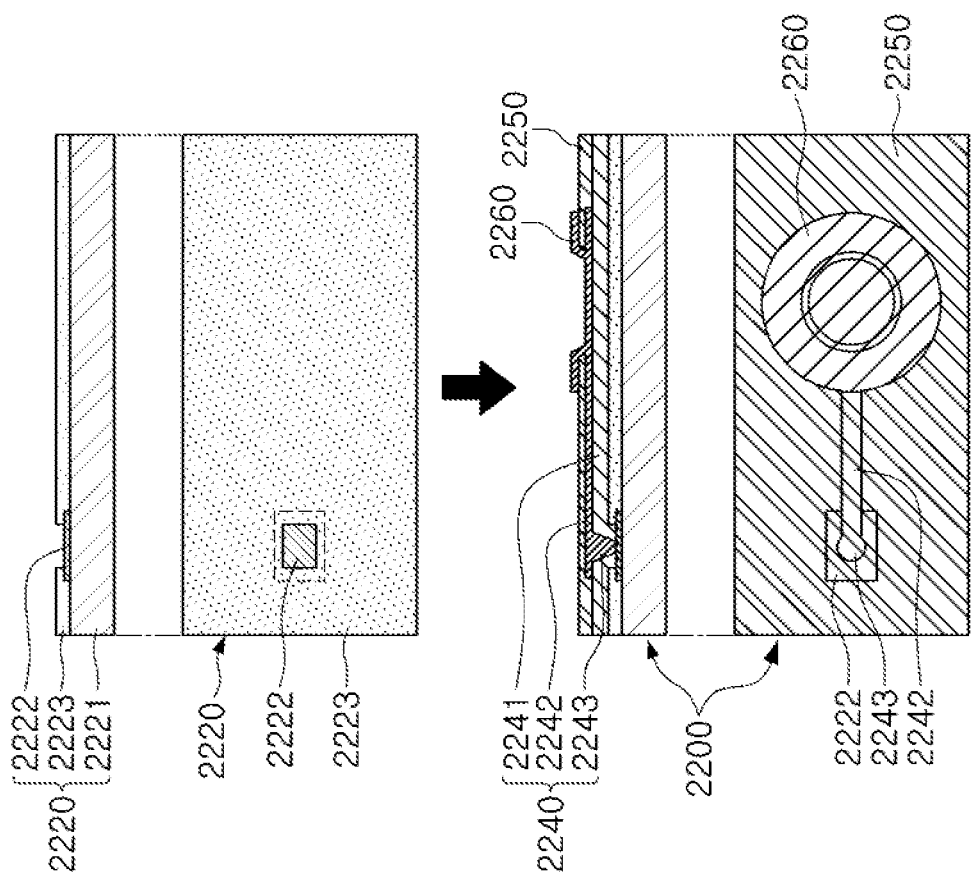
FIG. 3A
FIG. 3B

ANTENNA MODULE

CROSS-REFERENCE TO RELATED APPLICATION(S)

This application claims the benefit of priority to Korean Patent Application No. 10-2018-0076939 filed on Jul. 3, 2018 in the Korean Intellectual Property Office, the disclosure of which is incorporated herein by reference in its entirety.

TECHNICAL FIELD

The present disclosure relates to an antenna module in which an antenna member and a semiconductor package are disposed on a base substrate.

BACKGROUND

Existing 2G and 3G mobile communications have supplied a voice-oriented service and a starting point of a data service, while 4G mobile communications have provided a real data-centric mobile communications service. Recently, the contents of services that might only have been provided in wired communications until a few years ago, such as a multimedia service including moving pictures, Internet service, and the like, have become main contents, even in mobile environments. The reason for such a change of a service use pattern is that transmission speeds have been rapidly increased, as wireless networks have evolved from 3G networks to 4G networks and many services for providing discriminative customer experience in a mobile service market have been actively developed.

However, the evolution of a mobile communications network is not limited thereto, and new 5G mobile communications have been actively discussed in Korea and other countries. 5G mobile communications and a 5G convergence service have been studied depending on an environmental change of the fourth industrial revolution in which things are connected to each other and all services, such as the Internet of things (IoT), cloud computing environments, a self-driving cars, artificial intelligence (AI), virtual reality (VR), and the like, are connected to each other through a network.

Meanwhile, in 5G mobile communications, it is necessary to develop various types of technology that may overcome limitations of the existing 4G mobile communications, and it is expected that ultra high-speed transmission technology, large-capacity antenna technology, network capacity increasing technology, and 5G network operating technology will mainly be studied. However, terminals will be continuously miniaturized, and it thus becomes important to improve performance of the terminals so that sizes of the terminals are reduced and antenna efficiency of the terminals is increased.

SUMMARY

An aspect of the present disclosure may provide an antenna module of which a size may be reduced, in which loss of a radio frequency (RF) signal may be significantly reduced by reducing a length of a signal line in spite of the reduction in the size of the antenna module, and of which a height may also be reduced.

According to an aspect of the present disclosure, an antenna module may be provided, in which an antenna member and a semiconductor package are disposed, respectively, on and beneath a base substrate having a rigid region and a flexible region, that is, a rigid-flexible printed circuit board itself, the antenna member, the semiconductor package, and the base substrate are modularized.

According to an aspect of the present disclosure, an antenna module may include: a base substrate including a rigid region and a flexible region which is more flexible than the rigid region; an antenna member disposed on one surface of the rigid region of the base substrate and including antenna patterns; and a semiconductor package disposed on the other surface of the rigid region of the base substrate and including one or more semiconductor chips.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
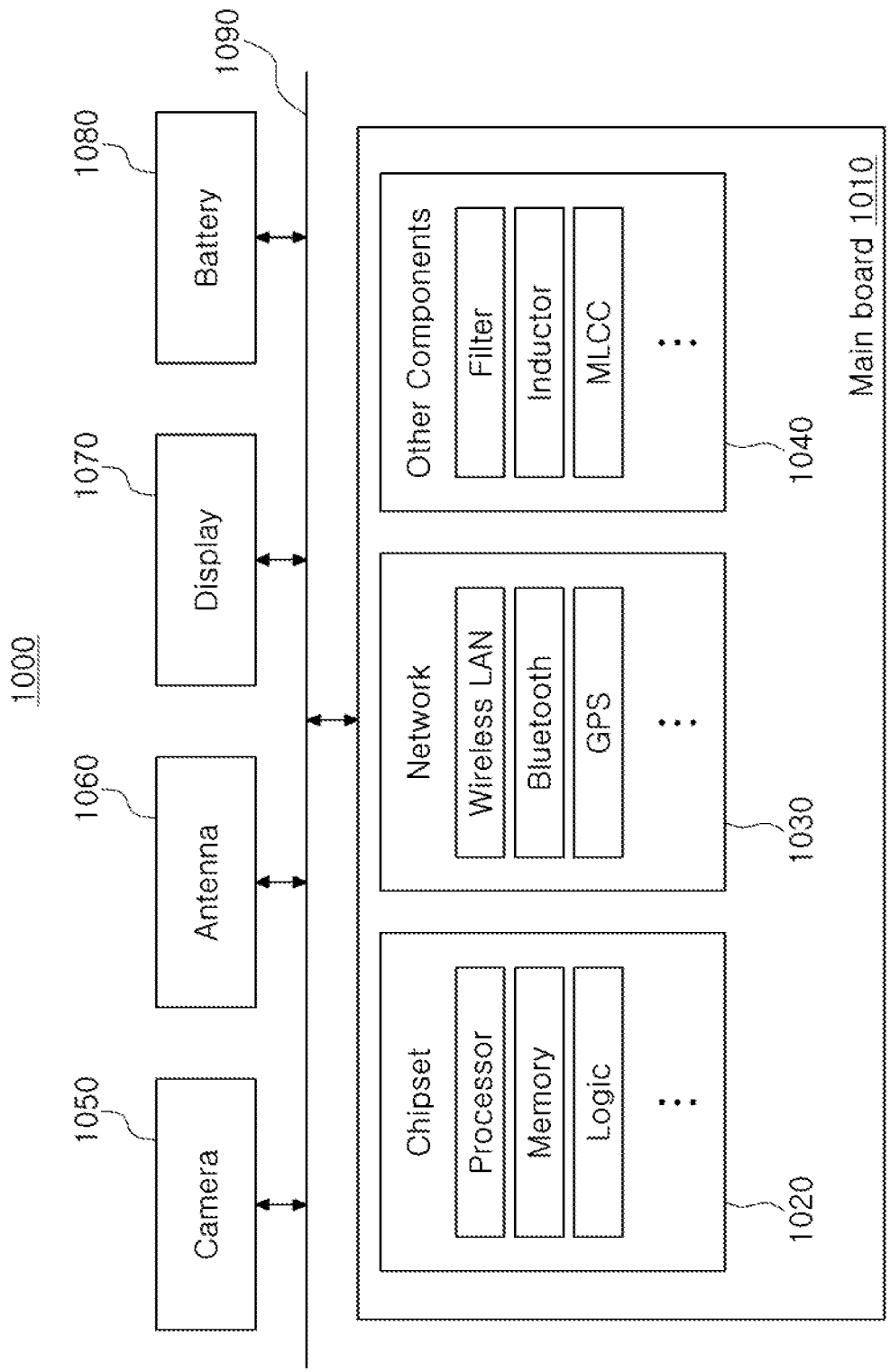
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
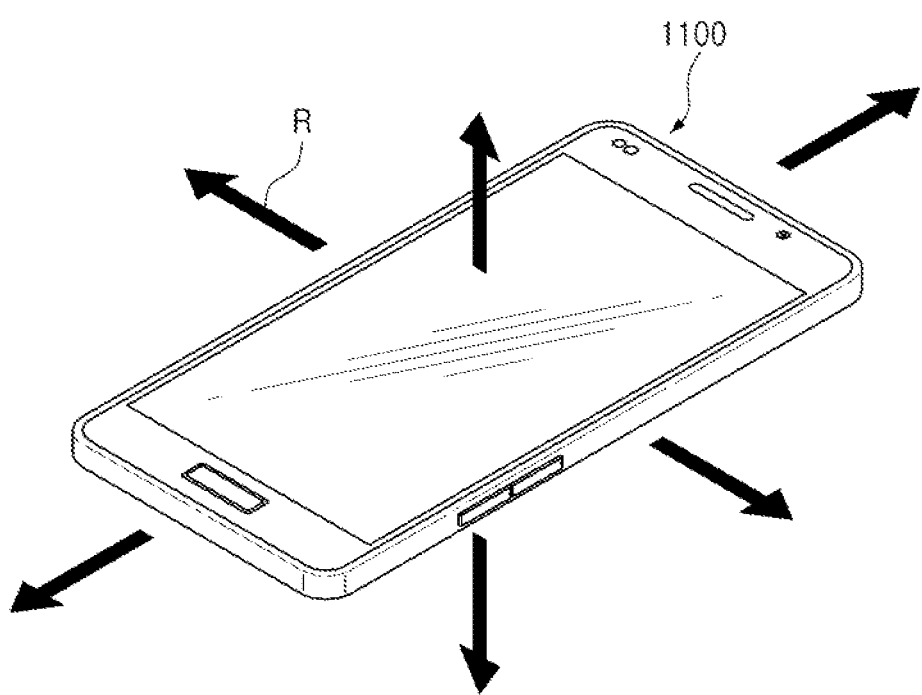
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
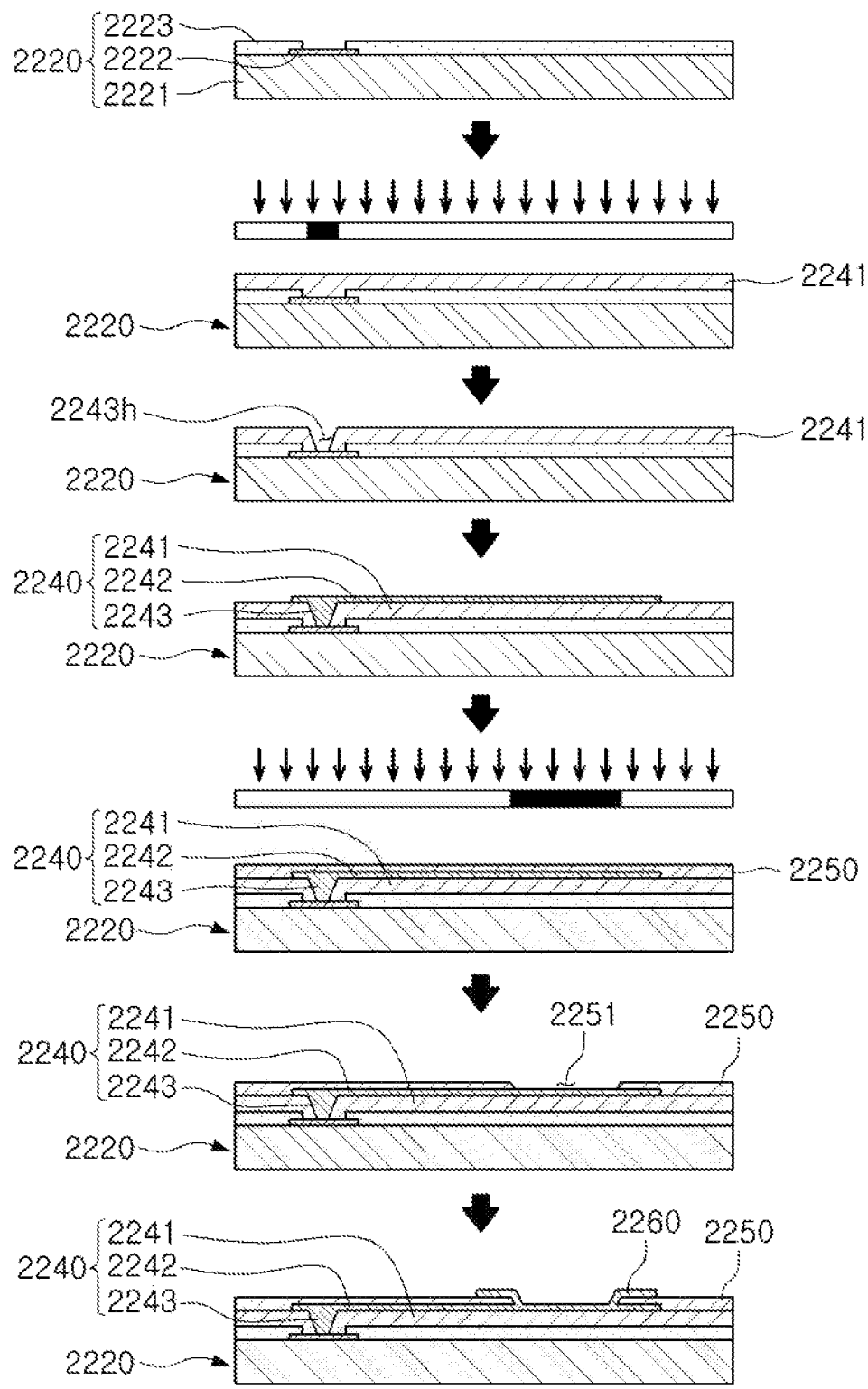
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a metal material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
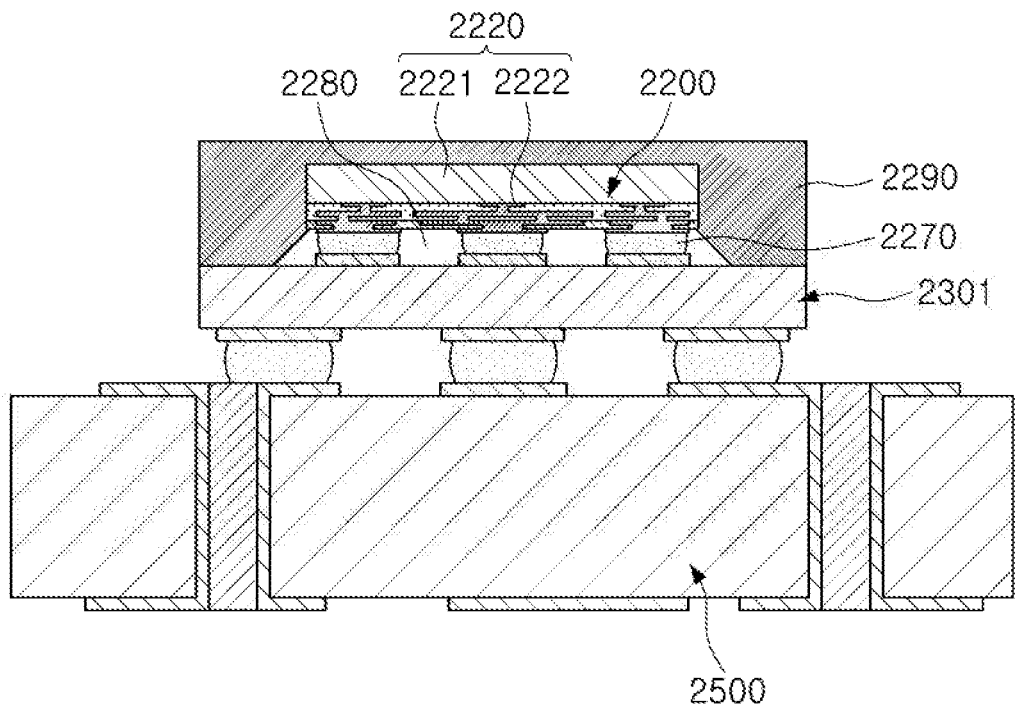
FIG. 5 is a schematic cross-sectional view illustrating a case in which a fan-in semiconductor package is mounted on a printed circuit substrate and is ultimately mounted on a mainboard of an electronic device.

FIG. 5 is a schematic cross-sectional view illustrating a case in which a fan-in semiconductor package is mounted on a printed circuit substrate and is ultimately mounted on a mainboard of an electronic device.

Figure 6:
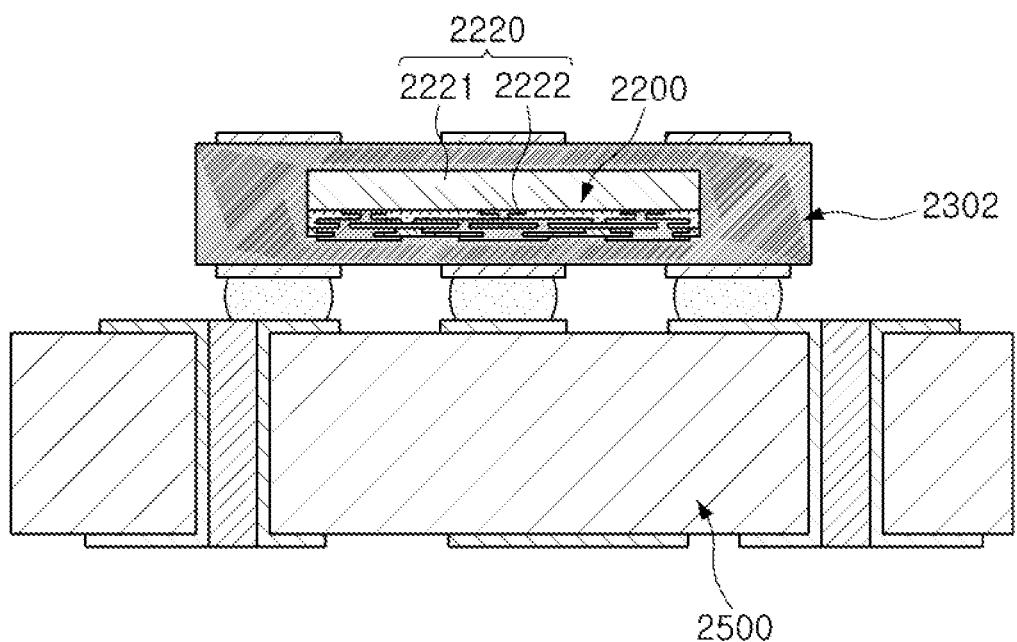
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
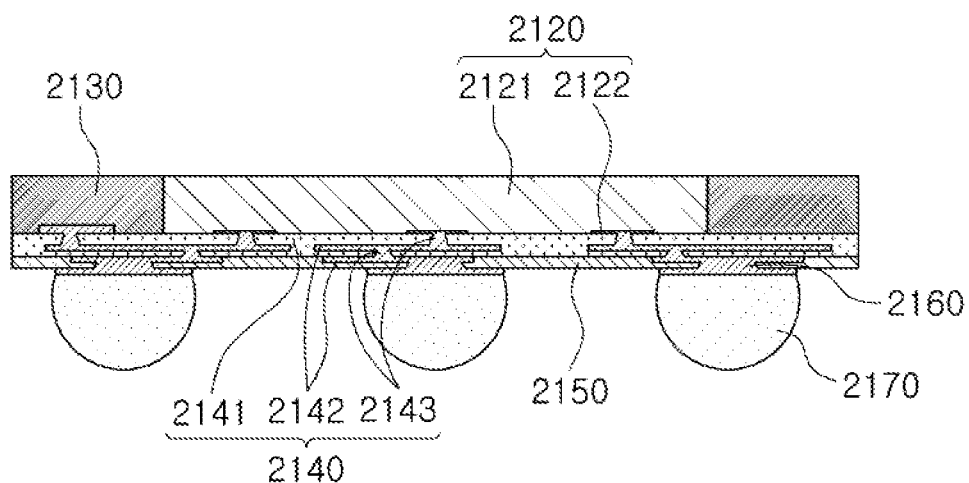
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
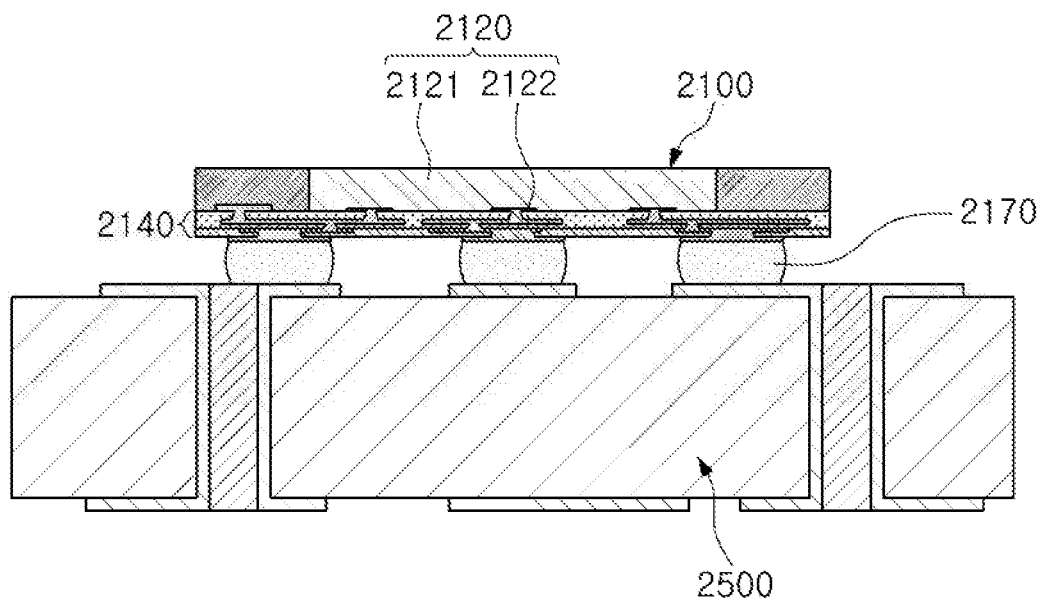
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Antenna Module

Figure 9:
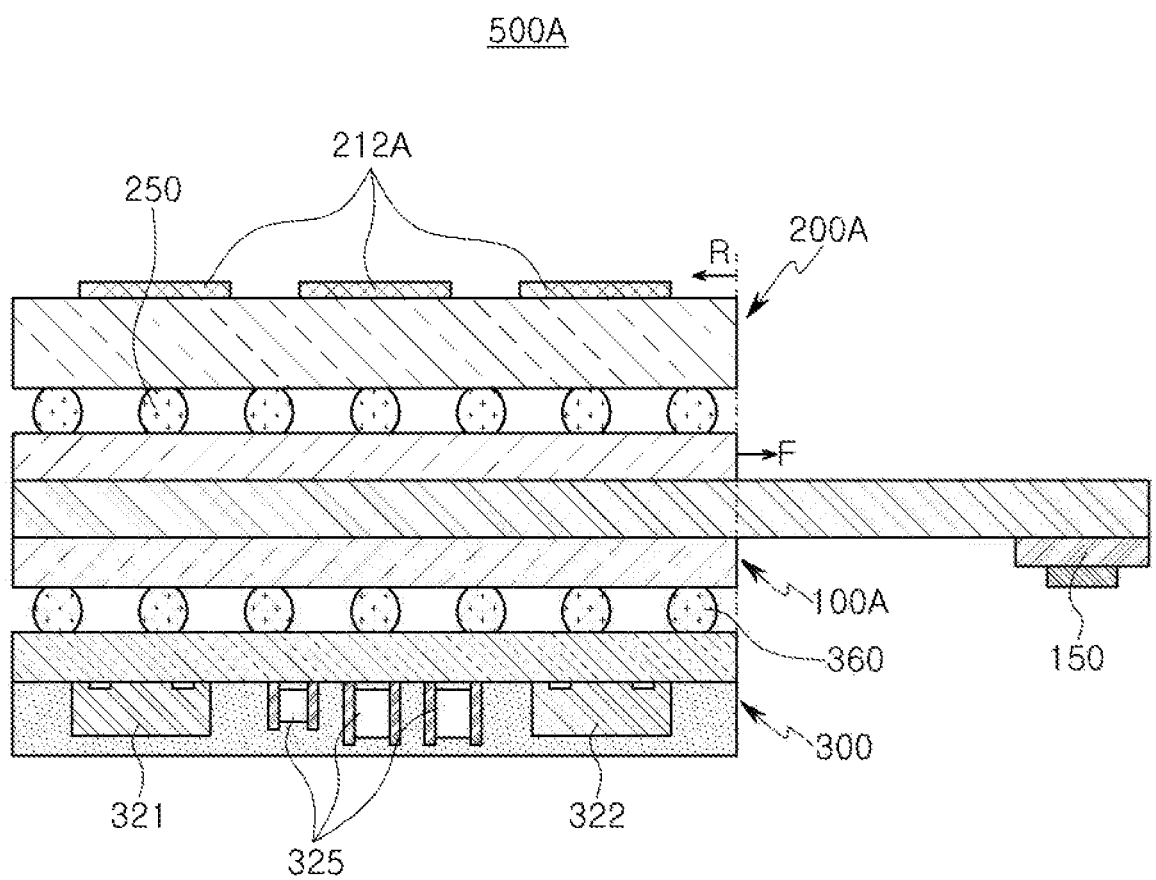
FIG. 9 is a schematic cross-sectional view illustrating an antenna module according to an exemplary embodiment in the present disclosure.

FIG. 9 is a schematic cross-sectional view illustrating an antenna module according to an exemplary embodiment in the present disclosure.

Referring to FIG. 9, an antenna module 500A according to an exemplary embodiment in the present disclosure may include a base substrate 100A including a rigid region R and a flexible region F which is more flexible than the rigid region R, an antenna member 200A disposed on one surface of the rigid region R of the base substrate 100A and including antenna patterns 212A, and a semiconductor package 300 disposed on the other surface of the rigid region R of the base substrate 100A and including one or more semiconductor chips 321 and 322. In this case, the antenna member 200A may be an antenna substrate 200A. The antenna substrate 200A may be mounted on one surface of the rigid region R of the base substrate 100A through electrical connection structures 250. The semiconductor package 300 may be mounted on the other surface of the rigid region R of the base substrate 100A through electrical connection structures 360.

A 5G radio frequency (RF) antenna module that has been recently developed has a structure in which an antenna is implemented in a pattern form on a printed circuit board (PCB) to manufacture an antenna substrate, a radio frequency integrated circuit (RFIC) is surface-mounted on the manufactured antenna substrate using solder balls, and the antenna substrate on which the RFIC is mounted is connected to a coaxial cable or a flexible PCB (FPCB) using a connector. In this case, the antenna module may ultimately be physically and/or electrically connected to a mainboard through the coaxial cable or the FPCB. However, in this case, an area occupied by the coaxial cable or the FPCB in addition to the antenna substrate may be significantly great. Therefore, there may be a difficulty in significantly reducing a size of the antenna module, and a path of an RF signal may be increased, such that it is likely that signal loss will be generated. In addition, there may be a limitation in significantly reducing a thickness of the antenna module.

On the other hand, in the antenna module 500A according to the exemplary embodiment, a rigid-flexible PCB (RFPCB) may be used as the base substrate 100A, the antenna substrate 200A and the semiconductor package 300 may be mounted on opposite surfaces of the rigid region R of the base substrate 100A, respectively, and a connector 150, or the like, may be connected to the flexible region F, such that the antenna module itself may be connected to a mainboard. That is, a separate coaxial cable or a separate FPCB may not be required. Therefore, a size of the antenna module 500A may be significantly reduced, and a path of an RF signal may be significantly reduced to reduce signal loss. In addition, since an RFIC 321, a power management IC (PMIC) 322, and various passive components 325 are packaged as a single package and disposed in the semiconductor package 300, a degree of integration may be increased, such that performance of the antenna module may be improved, and a thickness of the antenna module may also be significantly reduced.

Components of the antenna module 500A according to the exemplary embodiment will hereinafter be described in more detail with reference to the drawing.

The base substrate 100A may be a general rigid-flexible printed circuit board (RFPCB) having a rigid region R and a flexible region F. For example, the base substrate 100A may be formed by building up insulating layers and wiring layers on partial regions of opposite surfaces of a flexible copper clad laminate (FCCL) in which copper foil layers are formed on opposite surfaces of a core layer formed of a material having flexible characteristics, such as polyimide, to implement the rigid region R and not performing a build-up process on other partial regions on the opposite surfaces of the FCCL or performing the build-up process on other partial regions on the opposite surfaces of the FCCL and then removing other partial regions to implement the flexible region F. In this case, a thickness of the flexible region F may be less than a thickness of the rigid region R, due to removal of partial regions to implement the flexible region F and maintain of partial regions over the rigid region R. In order to provide an electrical connection path, through-wirings may be formed in the FCCL, and wiring vias for electrically connecting wiring layers formed on different layers to each other may be formed in the built-up insulating layers. However, the base substrate 100A is not limited thereto, and may be any known rigid-flexible PCB (RFPCB) formed by, for example, a coreless process.

A material of the core layer may be an insulating material having flexible characteristics, such as polyimide, polyether terephthalate, polyethylene naphthalate, or the like. However, the material of the core layer is not limited thereto, and may be any known insulating material having flexible characteristics. An insulating material may be used as a material of each of the insulating layers. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg or an Ajinomoto Build-up Film (ABF). However, the material of each of the insulating layers is not limited thereto, but may also be a photo-imagable dielectric (PID). When materials of the insulating layers are the same as each other, a boundary between the insulating layers may be apparent.

The wiring layers may include various signal patterns, ground patterns, power patterns, and the like. A material of each of the wiring layers may be a conductive material such as copper (Cu), aluminum (Al), silver (Ag), tin (Sn), gold (Au), nickel (Ni), lead (Pb), titanium (Ti), or alloys thereof, but is not limited thereto. The through-wirings and the wiring vias may electrically connect wiring layers formed on different layers to each other, resulting in an electrical path in the base substrate 100A. The through-wirings and the wiring vias may include signal vias, ground vias, and power vias, and the like. A material of each of the through-wirings and the wiring vias may be a conductive material such as copper (Cu), aluminum (Al), silver (Ag), tin (Sn), gold (Au), nickel (Ni), lead (Pb), titanium (Ti), or alloys thereof. Each of the through-wirings and the wiring vias may be completely filled with the conductive material, or the conductive material may be formed along a wall of each of via holes. In addition, each of the through-wirings and the wiring vias may have all of any known vertical cross-sectional shapes such as a cylindrical shape, an hourglass shape, a tapered shape, or the like.

The connector 150 may be disposed on an end portion of the flexible region F of the base substrate 100A. The connector 150 may physically and/or electrically connect the antenna module 500A to other components in a set when the antenna module 500A is disposed in the set. The connector 150 may include any known conductive material such as copper (Cu), aluminum (Al), silver (Ag), tin (Sn), gold (Au), nickel (Ni), lead (Pb), titanium (Ti), or alloys thereof.

The antenna substrate 200A may be a general printed circuit board (PCB) on which the antenna patterns 212A are formed. For example, the antenna substrate 200A may have a structure in which insulating layers and wiring layers are built-up on one surface or opposite surfaces of a copper clad laminate (CCL) in which copper foil layers are formed on opposite surfaces of a core layer formed of a material such as prepreg. In order to provide an electrical connection path, through-wirings may be formed in the CCL, and wiring vias for electrically connecting wiring layers formed on different layers to each other may be formed in the built-up insulating layers. However, the base substrate 200A is not limited thereto, and may be a PCB formed by, for example, a coreless process.

An insulating material may be used as a material of the core layer. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg. However, the material of the core layer is not limited thereto, and may be a glass plate or a ceramic plate. Alternatively, a liquid crystal polymer (LCP) having a low dielectric loss may also be used as the material of the core layer in order to reduce signal loss.

An insulating material may be used as a material of each of the insulating layers. In this case, the insulating material may be a thermosetting resin such as an epoxy resin, a thermoplastic resin such as a polyimide resin, a material including a reinforcing material such as an inorganic filler together with the thermosetting resin and the thermoplastic resin, for example, an ABF, in addition to the prepreg described above. Alternatively, a PID may be used as the material of each of the insulating layers. Alternatively, an LCP having a low dielectric loss may also be used as the material of the insulating layer in order to reduce signal loss. When materials of the insulating layers are the same as each other, a boundary between the insulating layers may be apparent.

The wiring layers may include the antenna patterns 212A substantially implementing a millimeter wave/5G antenna, or the like, and may further include ground patterns, feeding patterns, resistor patterns, or the like. The antenna patterns 212A may be a dipole antenna, a patch antenna, or the like, depending on a disposition and a shape of the antenna patterns 212A. Ground patterns may have a ground plane form. The antenna patterns 212A may be surrounded by ground patterns disposed on the same level, but are not limited thereto. The wiring layer may include signal patterns, power patterns, resistor patterns, or the like. A material of each of the wiring layers may be a conductive material such as copper (Cu), aluminum (Al), silver (Ag), tin (Sn), gold (Au), nickel (Ni), lead (Pb), titanium (Ti), or alloys thereof, but is not limited thereto.

The through-wirings and the wiring vias may electrically connect wiring layers formed on different layers to each other, resulting in an electrical path in the antenna substrate 200A. The through-wirings and wiring vias may include feeding vias, and may include ground vias, and the like. In addition, the through-wirings and wiring vias may include signal vias, power vias, or the like. The feeding vias may be connected to the antenna patterns 212A in an electrical manner and/or a signal manner. Some ground vias may tightly surround the feeding vias. A material of each of the through-wirings and the wiring vias may be a conductive material such as copper (Cu), aluminum (Al), silver (Ag), tin (Sn), gold (Au), nickel (Ni), lead (Pb), titanium (Ti), or alloys thereof. Each of the through-wirings and the wiring vias may be completely filled with the conductive material, or the conductive material may be formed along a wall of each of via holes. In addition, each of the through-wirings and the wiring vias may have all of any known vertical cross-sectional shapes such as a cylindrical shape, an hourglass shape, a tapered shape, or the like.

The electrical connection structures 250 may be configured to physically and/or electrically connect the antenna substrate 200A to the base substrate 100A. Each of the electrical connection structures 250 may be formed of a low melting point metal such as tin (Sn) or alloys including tin (Sn). In more detail, each of the electrical connection structures 250 may be formed of a solder, or the like. However, this is only an example, and a material of each of the electrical connection structures 250 is not particularly limited thereto. Each of the electrical connection structures 250 may be a land, a ball, a pin, or the like. The electrical connection structures 250 may be formed as a multilayer or single layer structure. When the electrical connection structures 250 are formed as a multilayer structure, the electrical connection structures 250 may include a copper (Cu) pillar and a solder. When the electrical connection structures 250 are formed as a single layer structure, the electrical connection structures 250 may include a tin-silver solder or copper (Cu). However, this is only an example, and the electrical connection structures 250 are not limited thereto. The number, an interval, a disposition form, and the like, of electrical connection structures 250 are not particularly limited, but may be sufficiently modified depending on design particulars by those skilled in the art.

The semiconductor package 300 may include the semiconductor chips 321 and 322. The semiconductor package 300 may further include the passive components 325. As described above, various types of semiconductor chips 321 and 322 and passive components 325 may be packaged as a single semiconductor package 300, such that the semiconductor package 300 capable of stably implementing various performances required in the antenna module even though the antenna module has a small thickness may be implemented. The semiconductor package 300 may include an encapsulant encapsulating the semiconductor chips 321 and 322 and the passive components 325 and a connection structure redistributing the semiconductor chips 321 and 322 and the passive components 325 and electrically connecting the semiconductor chips 321 and 322 and the passive components 325 to each other, which will be described in detail below.

The semiconductor chips 321 and 322 may include a first semiconductor chip 321 and a second semiconductor chip 322 performing different functions. In this case, the first semiconductor chip 321 may be a radio frequency integrated circuit (RFIC), the second semiconductor chip 322 may be a power management IC (PMIC), and the first and second semiconductor chips 321 and 322 may be electrically connected to each other within the single semiconductor package 300.

The passive component 325 may be any known passive component such as a capacitor, an inductor, or the like. As a non-restrictive example, the passive component 325 may be a multilayer ceramic capacitor (MLCC), a power inductor (PI), or the like.

The electrical connection structures 360 may be configured to physically and/or electrically connect the semiconductor package 300 to the base substrate 100A. Each of the electrical connection structures 360 may be formed of a low melting point metal such as tin (Sn) or alloys including tin (Sn). In more detail, each of the electrical connection structures 360 may be formed of a solder, or the like. However, this is only an example, and a material of each of the electrical connection structures 360 is not particularly limited thereto. Each of the electrical connection structures 360 may be a land, a ball, a pin, or the like. The electrical connection structures 360 may be formed as a multilayer or single layer structure. When the electrical connection structures 360 are formed as a multilayer structure, the electrical connection structures 360 may include a copper (Cu) pillar and a solder. When the electrical connection structures 360 are formed as a single layer structure, the electrical connection structures 360 may include a tin-silver solder or copper (Cu). However, this is only an example, and the electrical connection structures 360 are not limited thereto. The number, an interval, a disposition form, and the like, of electrical connection structures 360 are not particularly limited, but may be sufficiently modified depending on design particulars by those skilled in the art.

Figure 10:
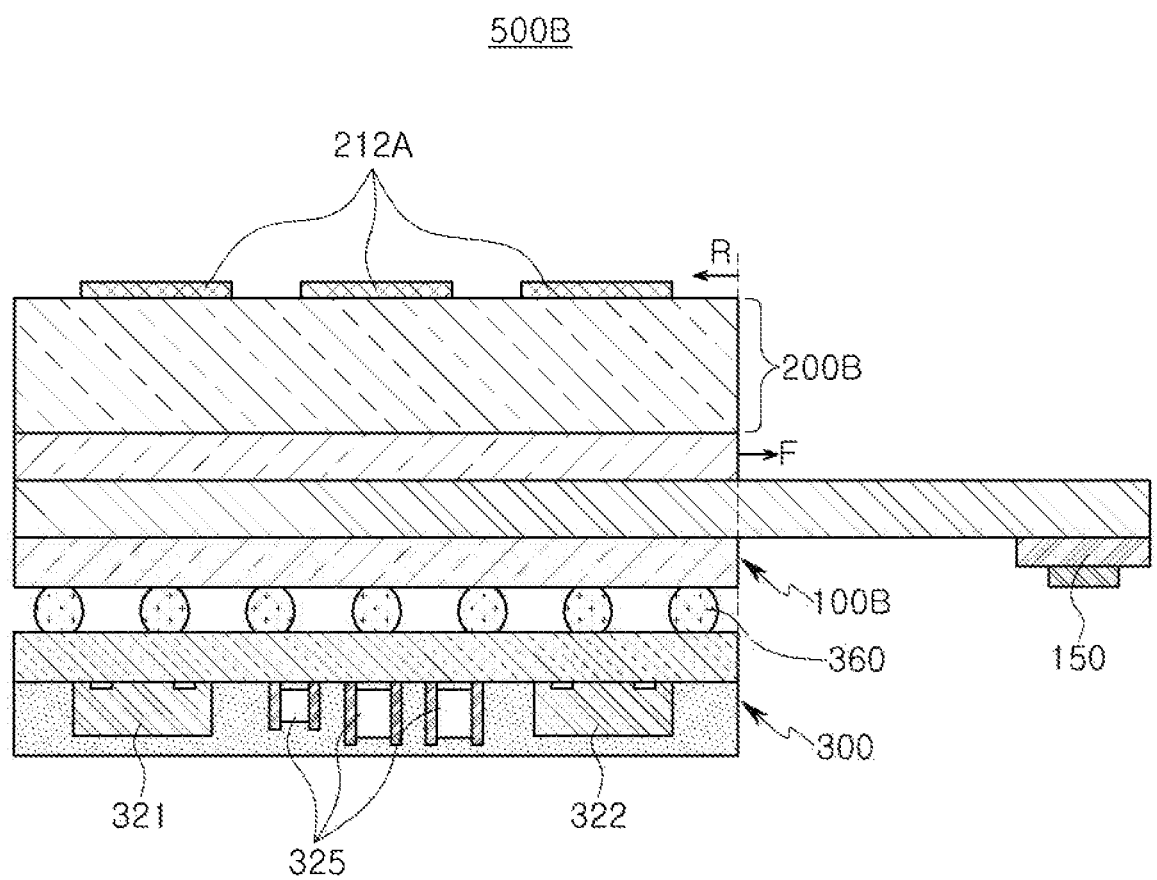
FIG. 10 is a schematic cross-sectional view illustrating an antenna module according to another exemplary embodiment in the present disclosure.

FIG. 10 is a schematic cross-sectional view illustrating an antenna module according to another exemplary embodiment in the present disclosure.

Referring to FIG. 10, in an antenna module 500B according to another exemplary embodiment in the present disclosure, an antenna member 200B may be integrated with a base substrate 100B. In more detail, the antenna member 200B may be built-up on one surface of a rigid region R of the base substrate 100B. That is, instead of forming a separate antenna substrate and then mounting the separate antenna substrate on the base substrate 100B, when the base substrate 100B is manufactured, build-up layers including antenna patterns 212A, ground patterns, feeding patterns, resistor patterns, and various vias may be additionally formed on the rigid region R of the base substrate 100B, and may then be used as the antenna member 200B. As described above, when the antenna member 200B is formed integrally with the base substrate 100B, a size of the antenna module 500B may be significantly reduced, and a path of an RF signal may be significantly reduced.

Other configurations overlap those described above in the antenna module 500A according to the exemplary embodiment, and a detailed description thereof is thus omitted.

Figure 11:
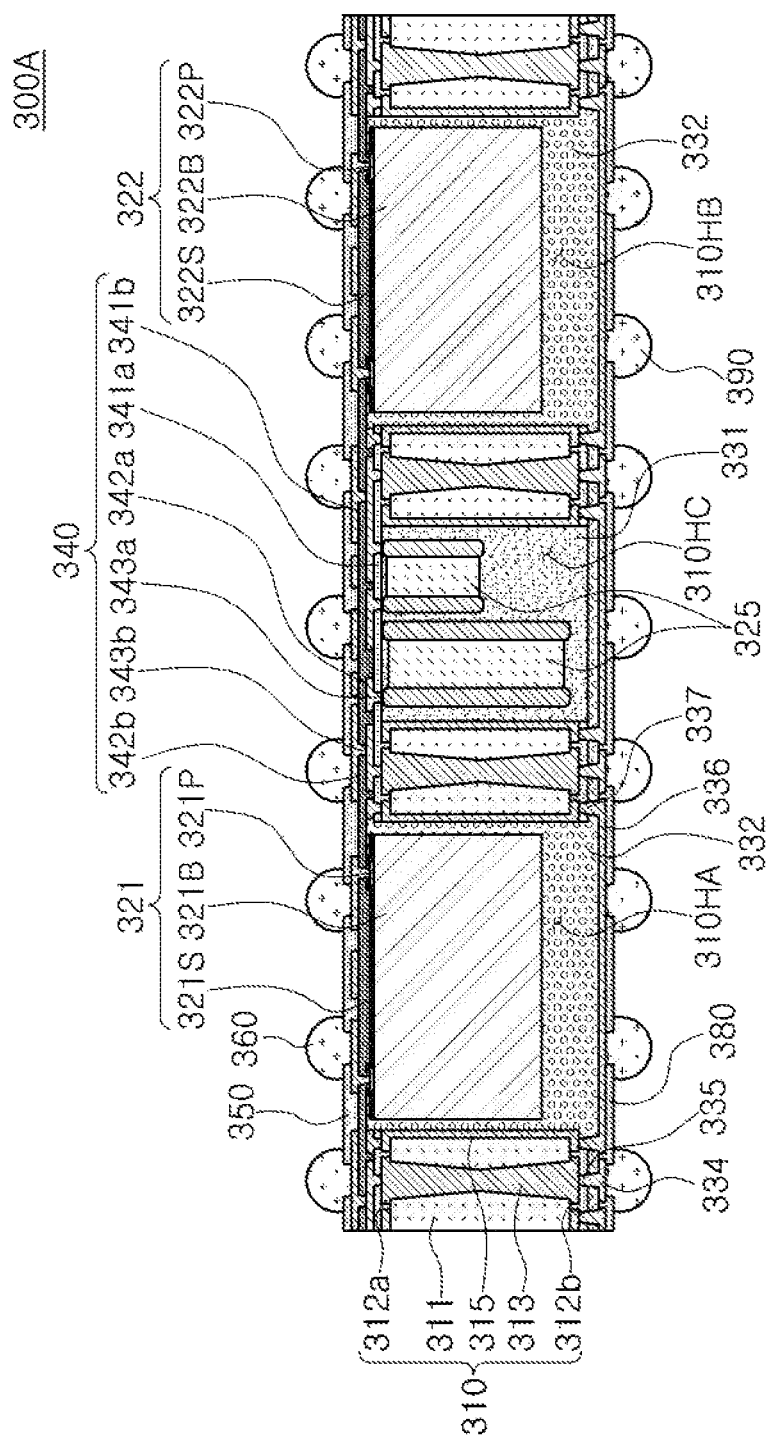
FIG. 11 is a schematic cross-sectional view illustrating a semiconductor package according to an exemplary embodiment used in the antenna module.

FIG. 11 is a schematic cross-sectional view illustrating a semiconductor package according to an exemplary embodiment used in the antenna module.

Referring to FIG. 11, a semiconductor package 300A according to an exemplary embodiment may include a frame 310 having first to third through-holes 310HA, 310HB, and 310HC and including a plurality of wiring layers 312a and 312b, a first semiconductor chip 321 disposed in the first through-hole 310HA and having a first active surface having first connection pads 321P disposed thereon and a first inactive surface opposing the first active surface, a second semiconductor chip 322 disposed in the second through-hole 310HB and having a second active surface having second connection pads 322P disposed thereon and a second inactive surface opposing the second active surface, one or more passive components 325 disposed in the third through-hole 310HC, encapsulants 331 and 332 covering at least portions of each of the frame 310, the first inactive surface of the first semiconductor chip 321, the second inactive surface of the second semiconductor chip 322, and the passive components 325 and filling at least portions of the first to third through-holes 310HA, 310HB, and 310HC, and a connection structure 340 disposed on the frame 310, the first active surface of the first semiconductor chip 321, the second active surface of the second semiconductor chip 322, and the passive components 325 and including redistribution layers 342a and 342b electrically connected to each of the first connection pads 321P, the second connection pads 322P, and the passive components 325.

The frame 310 may include the wiring layers 312a and 312b to thus reduce the number of layers of the connection structure 340. In addition, the frame 310 may improve rigidity of the semiconductor package 300A depending on certain materials of an insulating layer 311, and serve to secure uniformity of thicknesses of the encapsulants 331 and 332. A vertical electrical path may be provided in the semiconductor package 300A by the wiring layers 312a and 312b and connection vias 313 of the frame 310. The frame 310 may have the first to third through-holes 310HA, 310HB, and 310HC. The first semiconductor chip 321, the second semiconductor chip 322, and the passive components 325 may be disposed side by side in the first to third through-holes 310HA, 310HB, and 310HC, respectively, to be spaced apart from the frame 310 by predetermined distances. Side surfaces of the semiconductor chips 321 and 322 and the passive components 325 may be surrounded by the frame 310. However, such a form is only an example and may be variously modified to have other forms, and the frame 310 may perform another function depending on such a form.

The frame 310 may include an insulating layer 311, a first wiring layer 312a disposed on an upper surface of the insulating layer 311, a second wiring layer 312b disposed on a lower surface of the insulating layer 311, and connection vias 313 penetrating through the insulating layer 311 and electrically connecting the first and second wiring layers 312a and 312b to each other. The first and second wiring layers 312a and 312b of the frame 310 may have thicknesses greater than those of the redistribution layers 342a and 342b of the connection structure 340. Since the frame 310 may have a thickness similar to or greater than that of the semiconductor chips 321 and 322, or the like, the first and second wiring layers 312a and 312b may also be formed to have large sizes through a substrate process depending on a scale of the frame 310. On the other hand, the redistribution layers 342a and 342b of the connection structure 340 may be formed to have small sizes through a semiconductor process for thinness.

A material of the insulating layer 311 is not particularly limited. For example, an insulating material may be used as the material of the insulating layer 311. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, or the like, but is not limited thereto. For example, a glass or a ceramic based insulating material having required material characteristics may be used as the material of the insulating layer 311.

The wiring layers 312a and 312b may serve to redistribute the connection pads 321P and 322P of the semiconductor chips 321 and 322. In addition, the wiring layers 312a and 312b may be used as connection patterns when the semiconductor package 300A is electrically connected to other components disposed on and beneath the semiconductor package 300A. A material of each of the wiring layers 312a and 312b may be a conductive material such as copper (Cu), aluminum (Al), silver (Ag), tin (Sn), gold (Au), nickel (Ni), lead (Pb), titanium (Ti), or alloys thereof. The wiring layers 312a and 312b may perform various functions depending on designs of corresponding layers. For example, the wiring layers 312a and 312b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 312a and 312b may include via pads, and the like.

The connection vias 313 may electrically connect the wiring layers 312a and 312b formed on different layers to each other, resulting in an electrical path in the frame 310. A material of each of the connection vias 313 may be a conductive material such as copper (Cu), aluminum (Al), silver (Ag), tin (Sn), gold (Au), nickel (Ni), lead (Pb), titanium (Ti), or alloys thereof. Each of the connection vias 313 may be completely filled with the conductive material, or the conductive material may be formed along a wall of each of connection via holes. In addition, each of the connection vias 313 may have any known shape such as an hourglass shape, a cylindrical shape, and the like. The connection vias 313 may also include signal connection vias, ground connection vias, and the like.

A metal layer 315 may further be disposed on each of walls of the through-holes 310HA, 310HB, and 310HC of the frame 310, if necessary. The metal layer 315 may be formed over the entire wall of each of the through-holes 310HA, 310HB, and 310HC to surround the semiconductor chips 321 and 322 and the passive components 325. Therefore, heat dissipation characteristics may be improved, and an electromagnetic wave shielding effect may be achieved. The metal layer 315 may extend to an upper surface and a lower surface of the frame 310, that is, the upper surface and the lower surface of the insulating layer 311. A material of the metal layer 315 may be a conductive material such as copper (Cu), aluminum (Al), silver (Ag), tin (Sn), gold (Au), nickel (Ni), lead (Pb), titanium (Ti), or alloys thereof. The metal layer 315 may be electrically connected to ground patterns and/or power patterns of the first wiring layer 312a and/or the second wiring layer 312b to be used as a ground plane.

Each of the semiconductor chips 321 and 322 may be an integrated circuit (IC) in a bare state, provided in an amount of several hundred to several million or more elements integrated in a single chip. For example, the IC of the first semiconductor chip 321 may be an RFIC, and the IC of the second semiconductor chip 322 may be a PMIC. The semiconductor chips 321 and 322 may include bodies 321B and 322B on which various circuits are formed, respectively, and connection pads 321P and 322P may be formed on active surfaces of the bodies 321B and 322B, respectively. Each of the bodies 321B and 322B may be formed on the basis of, for example, an active wafer. In this case, a basic material of each of the bodies 321B and 322B may be silicon (Si), germanium (Ge), gallium arsenide (GaAs), or the like. The connection pads 321P and 322P may electrically connect the semiconductor chips 321 and 322 to other components, respectively, and a material of each of the connection pads 321P and 322P may be a conductive material such as aluminum (Al), but is not limited thereto. The active surfaces of the semiconductor chips 321 and 322 refer to surfaces of the semiconductor chip 321 and 322 on which the connection pads 321P and 322P are disposed, and the inactive surfaces of the semiconductor chips 321 and 322 refer to surfaces of the semiconductor chips 321 and 322 opposing the active surfaces. Passivation layers 321S and 322S having openings exposing at least portions of the connection pads 321P and 322P and formed of an oxide layer, a nitride layer, or the like, may be formed on the active surfaces of the semiconductor chips 321 and 322. The semiconductor chips 321 and 322 may be disposed in a face-up form. Therefore, when the semiconductor chips 321 and 322 are used in the antenna module 500A or 500B described above, the semiconductor chips 321 and 322 may have minimum signal paths up to the antenna substrate 100A or 100B.

The passive components 325 may be disposed in the third through-hole 310HC side by side with the semiconductor chips 321 and 322. The passive component 325 may be any known passive component such as a capacitor, an inductor, or the like. As a non-restrictive example, the passive component 325 may be at least one of a MLCC and a power inductor. The passive components 325 may be electrically connected to the connection pads 321P and 322P of the semiconductor chips 321 and 322 through the connection structure 340. The number of passive components 325 is not particularly limited. In the semiconductor package 300A according to the exemplary embodiment, a plurality of passive components 325 may be disposed together with the semiconductor chips 321 and 322 in one package. Therefore, an interval between components may be significantly reduced, and the semiconductor package 300A may thus be miniaturized. In addition, electrical paths between the semiconductor chips 321 and 322 and the passive components 325 may be significantly reduced to suppress noise.

The encapsulants 331 and 332 may be configured to protect the semiconductor chips 321 and 322, the passive components 325, and the like, and provide an insulating region. An encapsulation form of the encapsulants 331 and 332 is not particularly limited, and may be a form in which the encapsulants 331 and 332 surround at least portions of the semiconductor chips 321 and 322 and the passive components 325. For example, the encapsulants 331 and 332 may cover the lower surface of the frame 310, cover side surfaces and the inactive surfaces of the semiconductor chips 321 and 322, and cover side surfaces and lower surfaces of the passive components 325. In addition, the encapsulants 331 and 332 may fill at least portions of the respective spaces in the through-holes 310HA, 310HB, and 310HC. Certain materials of the encapsulants 331 and 332 are not particularly limited, and may be, for example, an insulating material such as an ABF, or the like. Alternatively, a photoimagable encapsulant (PIE) may be used as the material of each of the encapsulants 331 and 332. If necessary, a thermally conductive material and/or a magnetic material may be included in the encapsulants 331 and 332, more specifically, the second encapsulant 332 in order to improve heat dissipation characteristics and/or electromagnetic wave shielding characteristics.

The encapsulants 331 and 332 may include a first encapsulant 331 covering at least portions of each of the frame 310 and the passive components 325 and filling at least portions of the third through-hole 310HC and a second encapsulant 332 covering at least portions of each of the first encapsulant 331 and the first and second semiconductor chips 321 and 322 and filling at least portions of each of the first and second through-holes 310HA and 310HB. As described above, when two or more encapsulating processes rather than one encapsulating process are performed, a yield problem of the semiconductor chips 321 and 322 due to a mounting defect of the passive components 325 or an influence of foreign materials occurring at the time of mounting the passive components 325 may be significantly reduced.

A backside wiring layer 334 and a backside metal layer 336 may be disposed on lower surfaces of the encapsulants 331 and 332. The backside wiring layer 334 may be connected to the second wiring layer 312b of the frame 310 through backside connection vias 335 penetrating through the encapsulants 331 and 332. The backside metal layer 336 may be connected to the metal layer 315 of the frame 310 through backside metal vias 337 penetrating through the encapsulants 331 and 332. Each of the backside wiring layer 334, the backside metal layer 336, the backside connection vias 335, and the backside metal vias 337 may include a conductive material such as copper (Cu), aluminum (Al), silver (Ag), tin (Sn), gold (Au), nickel (Ni), lead (Pb), titanium (Ti), or alloys thereof. The backside wiring layer 334 may include signal patterns, signal via pads, or the like. The backside metal layer 336 may cover the inactive surfaces of the semiconductor chips 321 and 322 and the passive components 325, and may be connected to the metal layer 315 through the backside metal vias 337 to implement an excellent heat dissipation effect and an excellent electromagnetic wave shielding effect. The backside metal layer 336 may be connected to the ground patterns and/or the power patterns of the wiring layers 312a and 312b of the frame 310 to be used as a ground.

The connection structure 340 may redistribute the connection pads 321P and 322P of the semiconductor chips 321 and 322. Several tens to several hundreds of connection pads 321P and 322P of the semiconductor chips 321 and 322 having various functions may be redistributed by the connection structure 340. In addition, the connection structure 340 may electrically connect the connection pads 321P and 322P of the semiconductor chips 321 and 322 to the passive components 325. In addition, the connection structure 340 may provide electrical connection paths between the semiconductor package and the base substrate 100A or 100B, the antenna member 200A or 200B, and the like, of the antenna module 500A or 500B described above.

In the exemplary embodiment, the connection structure 340 may include a first insulating layer 341a disposed on the frame 310 and the passive components 325, a first redistribution layer 342a disposed on an upper surface of the first insulating layer 341a, first connection vias 343a penetrating through the first insulating layer 341a and electrically connecting the passive components 325 and the first redistribution layer 342a to each other, a second insulating layer 341b disposed on the upper surface of the first insulating layer 341a and the active surfaces of the semiconductor chips 321 and 322 and covering at least portions of the first redistribution layer 342a, a second redistribution layer 342b disposed on an upper surface of the second insulating layer 341b, and second connection vias 343b penetrating through the second insulating layer 341b and electrically connecting the first and second redistribution layers 342a and 342b, the connection pads 321P and 322P of the semiconductor chips 321 and 322, and the second redistribution layer 342b to each other.

A material of the first insulating layer 341a may be an insulating material. In this case, the insulating material may be a non-photosensitive insulating material including an inorganic filler such as silica or alumina, for example, an ABF. In this case, an undulation problem and a defect problem due to occurrence of a crack may be more effectively solved. In addition, a defect problem in which electrodes of the passive components 325 are opened due to bleeding of a material of the first encapsulant 331 may also be effectively solved. That is, when the non-photosensitive insulating material including the inorganic filler is used as the material of the first insulating layer 341a, a problem occurring when a PID is used as the material of the first insulating layer 341a may be more effectively solved.

A material of the second insulating layer 341b may be a PID. In this case, a fine pitch may be introduced through photo-vias, and several tens to several hundreds of connection pads 321P and 322P of the semiconductor chips 321 and 322 may thus be very effectively redistributed as in a general case. The PID may include a small amount of inorganic filler or may not include the inorganic filler. That is, materials of the first redistribution layer 342a for redistributing the passive components 325, the first insulating layer 341a in which the first connection vias 343a are formed, the second redistribution layer 342b for redistributing the connection pads 321P and 322P of the semiconductor chips 321 and 322, and the second insulating layer 341b in which the second connection vias 343b are formed may be selectively controlled, resulting in a more excellent synergy effect. If necessary, a PID having a low dielectric dissipation factor may be used as the material of the second insulating layer 341b.

If necessary, the first insulating layer 341a formed of the non-photosensitive insulating material including the inorganic filler may be a plurality of layers, the second insulating layer formed of the PID may be a plurality of layers, and both of the first insulating layer 341a and the second insulating layer 341b may be a plurality of layers.

The first and second through-holes 310HA and 310HB may penetrate through the first insulating layer 341a formed of the non-photosensitive insulating material, and when the first insulating layer 341a is the plurality of layers, the first and second through-holes 310H and 310HB may penetrate through all of the plurality of layers. That is, depths of the first and second through-holes 310HA and 310HB may be deeper than that of the third through-hole 310HC, and bottom surfaces of the first and second through-holes 310HA and 310HB may be disposed on a level above a bottom surface of the third through-hole 310HC. That is, these bottom surfaces may have a step therebetween. The bottom surfaces of the first and second through-holes 310HA and 310HB may be a lower surface of the second insulating layer 341b, and the bottom surface of the third through-hole 310HC may be a lower surface of the first insulating layer 341a. The active surfaces of the semiconductor chips 321 and 322 may be disposed on a level below a lower surface of the passive component 325. For example, the active surfaces of the semiconductor chips 321 and 322 may be substantially coplanar with an upper surface of a first wiring layer 312a. That is, the first insulating layer 341a and the first redistribution layer 342a may be primarily formed in order to redistribute the passive components 325, and the second insulating layer 341b and the second redistribution layer 342b may then be formed on another level in order to redistribute the semiconductor chips 321 and 322. In this case, an undulation problem and a crack occurrence problem may be more effectively solved.

The first insulating layer 341a may have a coefficient of thermal expansion (CTE) smaller than that of the second insulating layer 341b. The reason is that the first insulating layer 341a includes an inorganic filter 341af. The second insulating layer 341b may also include a small amount of inorganic filler, if necessary. However, in this case, a weight percent of the inorganic filler included in the first insulating layer 341a may be larger than that of the inorganic filler included in the second insulating layer 341b. Therefore, the CTE of the first insulating layer 341a may be smaller than that of the second insulating layer 341b. Since the first insulating layer 341a having a relatively larger amount of inorganic filler to have a relatively small CTE is advantageous in view of suppression of warpage due to low heat hardening contraction, the undulation problem and the crack occurrence problem as described above may be effectively solved, and a defect problem in which electrodes of the passive components 325 are opened may also be effectively solved.

The first redistribution layer 342a may redistribute the electrodes of the passive components 325 to electrically connect the electrodes of the passive components 325 to the connection pads 321P and 322P of the semiconductor chips 321 and 322. That is, the first redistribution layers 342a may serve as redistribution layers (RDLs). A material of the first redistribution layer 342a may be a conductive material such as copper (Cu), aluminum (Al), silver (Ag), tin (Sn), gold (Au), nickel (Ni), lead (Pb), titanium (Ti), or alloys thereof. The first redistribution layer 342a may perform various functions depending on a design. For example, the first redistribution layer 342a may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 342a may include via pads, and the like.

The second redistribution layers 342b may redistribute the connection pads 321P and 322P of the semiconductor chips 321 and 322 to electrically connect the connection pads 321P and 322P of the semiconductor chips 321 and 322 to first electrical connection structures 360. That is, the second redistribution layers 342b may serve as redistribution layers (RDLs). A material of the second redistribution layer 342b may be a conductive material such as copper (Cu), aluminum (Al), silver (Ag), tin (Sn), gold (Au), nickel (Ni), lead (Pb), titanium (Ti), or alloys thereof. The second redistribution layers 342b may also perform various functions depending on a design. For example, the second redistribution layers 342b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layers 342b may include via pads, electrical connection structure pads, and the like.

The first connection vias 343a may electrically connect the passive components 325 and the first redistribution layer 342a to each other. The first connection vias 343a may be in physical contact with electrodes of each of the passive components 325. That is, the passive components 325 may be embedded components rather than surface-mounting type components using solder bumps, or the like, and may be in direct contact with the first connection vias 343a. A material of each of the first connection vias 343a may be a conductive material such as copper (Cu), aluminum (Al), silver (Ag), tin (Sn), gold (Au), nickel (Ni), lead (Pb), titanium (Ti), or alloys thereof. Each of the first connection vias 343a may be completely filled with the conductive material, or the conductive material may also be formed along a wall of each of via holes. In addition, each of the first connection vias 343a may have a tapered shape.

The second connection vias 343b may electrically connect the first and second redistribution layers 342a and 342b formed on different layers to each other, and electrically connect the connection pads 321P and 322P of the semiconductor chips 321 and 322 and the second redistribution layer 342b to each other. The second connection vias 343b may be in physical contact with the connection pads 321P and 322P of the semiconductor chips 321 and 322. That is, the semiconductor chips 321 and 322 may be directly connected to the second connection vias 343b of the connection structure 340 in a state in which separate bumps, or the like, do not exist, in a bare die form. A material of each of the second connection vias 343b may be a conductive material such as copper (Cu), aluminum (Al), silver (Ag), tin (Sn), gold (Au), nickel (Ni), lead (Pb), titanium (Ti), or alloys thereof. The second connection via 343b may also be completely filled with a conductive material, or the conductive material may also be formed along a wall of each of via holes. In addition, each of the second connection vias 343b may also have a tapered shape.

A first passivation layer 350 may be disposed on the connection structure 340. The first passivation layer 350 may protect the connection structure 340 from external physical or chemical damage. The first passivation layer 350 may have openings exposing at least portions of the second redistribution layer 342b of the connection structure 340. The number of openings formed in the first passivation layer 350 may be several tens to several thousands. The first passivation layer 350 may include an insulating resin and an inorganic filler, but may not include a glass fiber. For example, the first passivation layer 350 may be formed of an ABF. However, the first passivation layer 350 is not limited thereto, and may also be formed of a PID, a solder resist, or the like.

A plurality of first electrical connection structures 360 electrically connected to the exposed second redistribution layer 342b may be disposed on the openings 351 of the first passivation layer 350. The first electrical connection structures 360 may be configured to physically and/or electrically connect the semiconductor package 300A to the base substrate 100A or 100B. Each of the first electrical connection structures 360 may be formed of a low melting point metal, for example, tin (Sn) or an alloy including tin (Sn), more specifically, a solder. However, this is only an example, and a material of each of the first electrical connection structures 360 is not particularly limited thereto. Each of the first electrical connection structures 360 may be a land, a ball, a pin, or the like. The first electrical connection structures 360 may be formed as a multilayer or single layer structure. When the first electrical connection structures 360 are formed as a multilayer structure, the first electrical connection structures 360 may include a copper (Cu) pillar and a solder. When the first electrical connection structures 360 are formed as a single layer structure, the first electrical connection structures 360 may include a tin-silver solder or copper (Cu). However, this is only an example, and the first electrical connection structures 360 are not limited thereto. The number, an interval, a disposition, or the like, of first electrical connection structures 360 are not particularly limited, but may be sufficiently modified by a person skilled in the art depending on design particulars. At least one of the first electrical connection structures 360 may be disposed in a fan-out region. The fan-out region refers to a region except for a region in which the semiconductor chips 321 and 322 are disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

A second passivation layer 380 covering at least portions of the backside wiring layer 334 and/or the backside metal layer 336 may be disposed beneath the encapsulants 331 and 332. The second passivation layer 380 may protect the backside wiring layer 334 and/or the backside metal layer 336 from external physical or chemical damage. The second passivation layer 380 may also include an insulating resin and an inorganic filler, but may not include a glass fiber. For example, the second passivation layer 380 may be formed of an ABF. However, the second passivation layer 380 is not limited thereto, and may also be formed of a PID, a solder resist, or the like.

The second passivation layer 380 may have openings exposing at least portions of the backside wiring layer 334 and/or the backside metal layer 336, and a plurality of second electrical connection structures 390 may be disposed on the openings. The second electrical connection structures 390 may be configured to physically and/or electrically connect the antenna module 500A or 500B to a mainboard, or the like, if necessary. Each of the second electrical connection structures 390 may be formed of a low melting point metal, for example, tin (Sn) or an alloy including tin (Sn), more specifically, a solder. However, this is only an example, and a material of each of the second electrical connection structures 390 is not particularly limited thereto. Each of the second electrical connection structures 390 may be a land, a ball, a pin, or the like. The second electrical connection structures 390 may be formed as a multilayer or single layer structure. When the second electrical connection structures 390 are formed as a multilayer structure, the second electrical connection structures 390 may include a copper (Cu) pillar and a solder. When the second electrical connection structures 390 are formed as a single layer structure, the second electrical connection structures 390 may include a tin-silver solder or copper (Cu). However, this is only an example, and the second electrical connection structures 390 are not limited thereto. The number, an interval, a disposition, or the like, of second electrical connection structures 390 are not particularly limited, but may be sufficiently modified by a person skilled in the art depending on design particulars. At least one of the second electrical connection structures 390 may be disposed in a fan-out region. The fan-out region refers to a region except for a region in which the semiconductor chips 321 and 322 are disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 12:
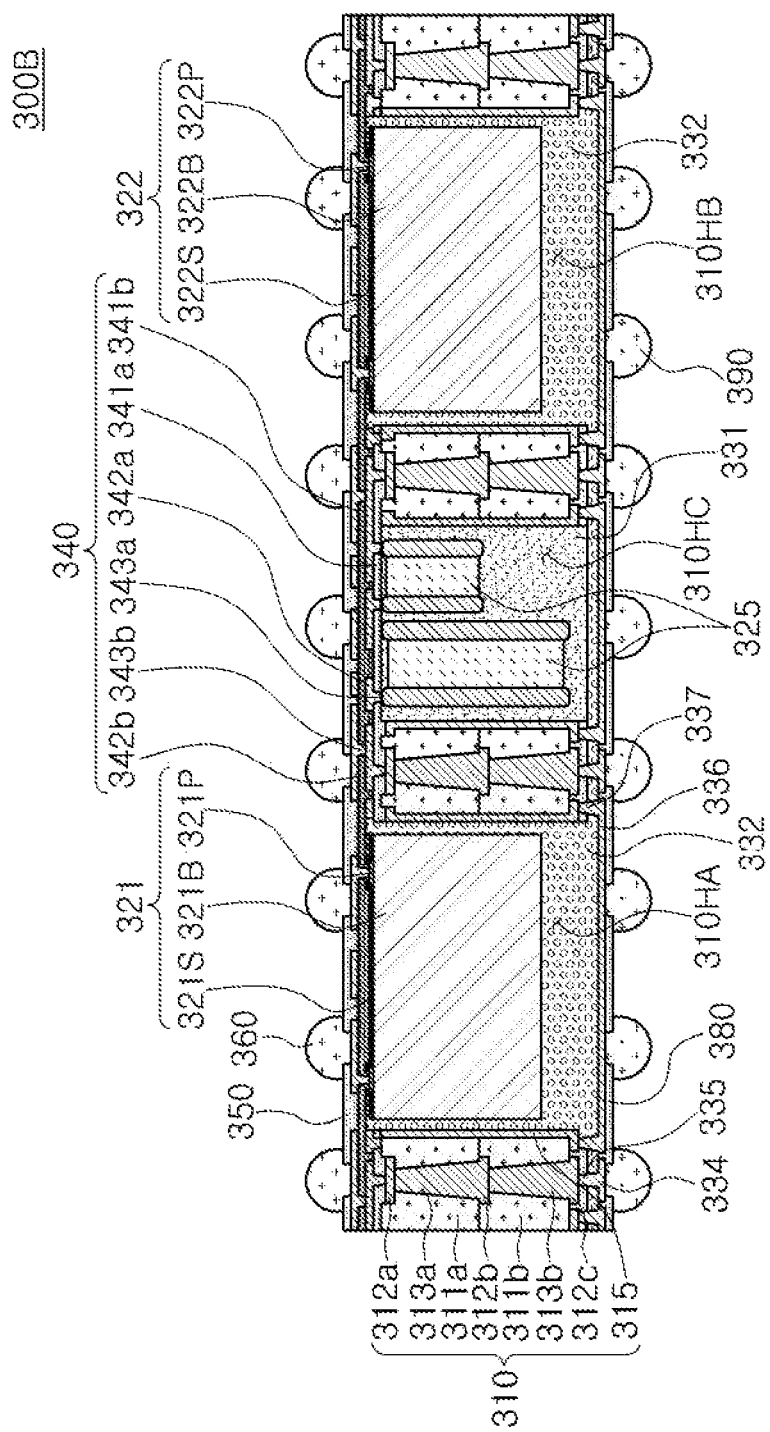
FIG. 12 is a schematic cross-sectional view illustrating a semiconductor package according to another exemplary embodiment used in the antenna module.

FIG. 12 is a schematic cross-sectional view illustrating a semiconductor package according to another exemplary embodiment used in the antenna module.

Referring to FIG. 12, in a semiconductor package 300B according to another exemplary embodiment, a frame 310 may include a first insulating layer 311a, a first wiring layer 312a embedded in an upper side of the first insulating layer 311a so that an upper surface thereof is exposed, a second wiring layer 312b disposed on a lower surface of the first insulating layer 311a, a second insulating layer 311b disposed on the lower surface of the first insulating layer 311a and covering the second wiring layer 312b, and a third wiring layer 312c disposed on a lower surface of the second insulating layer 311b. Since the frame 310 may include a large number of wiring layers 312a, 312b, and 312c, a connection structure 340 may further be simplified. Therefore, a decrease in a yield depending on a defect occurring in a process of forming the connection structure 340 may be suppressed. The first and second wiring layers 312a and 312b and the second and third wiring layers 312b and 312c may be electrically connected to each other through first and second connection vias 313a and 313b penetrating through the first and second insulating layers 311a and 311b, respectively.

When the first wiring layer 312a is embedded in the first insulating layer 311a, a step generated due to a thickness of the first wiring layer 312a may be significantly reduced, and an insulating distance of the connection structure 340 may thus become constant. That is, a difference between a distance from a redistribution layer 342a of the connection structure 340 to an upper surface of the first insulating layer 311a and a distance from the redistribution layer 342a of the connection structure 340 to connection pads 321P and 322P of semiconductor chips 321 and 322 may be smaller than a thickness of the first wiring layer 312a. Therefore, a high density wiring design of the connection structure 340 may be easy.

A distance between the redistribution layer 342a of the connection structure 340 and the first wiring layer 312a of the frame 310 may be greater than that between the redistribution layer 342a of the connection structure 340 and the connection pads 321P and 322P of the semiconductor chips 321 and 322. The reason is that the first wiring layer 312a may be recessed into the first insulating layer 311a. As described above, when the first wiring layer 312a is recessed into the first insulating layer 311a, such that the upper surface of the first insulating layer 311a and the upper surface of the first wiring layer 312a have a step therebetween, a phenomenon in which a material of an encapsulant 332 bleeds to pollute the first wiring layer 312a may be prevented. The second wiring layer 312b of the frame 310 may be disposed on a level between an active surface and an inactive surface of each of the semiconductor chips 321 and 322.

Thicknesses of the wiring layers 312a, 312b, and 312c of the frame 310 may be greater than those of the redistribution layers 342 of the connection structure 340. Since the frame 310 may have a thickness equal to or greater than that of the semiconductor chips 321 and 322, the wiring layers 312a, 312b, and 312c may be formed to have large sizes depending on a scale of the frame 310. On the other hand, the redistribution layers 342 of the connection structure 340 may be formed to have sizes relatively smaller than those of the wiring layers 312a, 312b, and 312c for thinness.

A material of each of the insulating layers 311a and 311b is not particularly limited. For example, an insulating material may be used as the material of each of the insulating layers 311a and 311b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, Bismaleimide Triazine (BT), or the like. Alternatively, a PID resin may also be used as the insulating material.

The wiring layers 312a, 312b, and 312c may serve to redistribute the connection pads 321P and 322P of the semiconductor chips 321 and 322. A material of each of the wiring layers 312a, 312b, and 312c may be a conductive material such as copper (Cu), aluminum (Al), silver (Ag), tin (Sn), gold (Au), nickel (Ni), lead (Pb), titanium (Ti), or alloys thereof. The wiring layers 312a, 312b, and 312c may perform various functions depending on designs of corresponding layers. For example, the wiring layers 312a, 312b, and 312c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 312a, 312b, and 312c may include signal via pads, ground via pads, and the like. In addition, the wiring layers 312a, 312b, and 312c may include feeding patterns.

The connection vias 313a and 313b may electrically connect the wiring layers 312a, 312b, and 312c formed on different layers to each other, resulting in an electrical path in the frame 310. A material of each of the connection vias 313a and 313b may be a conductive material. Each of the connection vias 313a and 313b may be completely filled with the conductive material, or the conductive material may also be formed along a wall of each of via holes. In addition, each of the connection vias 313a and 313b may have a tapered shape of which a direction is opposite to that of each of redistribution vias 343 of the connection structure 340. When holes for the first connection vias 313a are formed, some of the pads of the first wiring layer 312a may serve as a stopper, and it may thus be advantageous in a process that each of the first connection vias 313a has the tapered shape of which a width of a lower surface is greater than that of an upper surface. In this case, the first connection vias 313a may be integrated with pad patterns of the second wiring layer 312b. In addition, when holes for the second connection vias 313b are formed, some of the pads of the second wiring layer 312b may serve as a stopper, and it may thus be advantageous in a process that each of the second connection vias 313b has the tapered shape of which a width of a lower surface is greater than that of an upper surface. In this case, the second connection vias 313b may be integrated with pad patterns of the third wiring layer 312c.

Other configurations overlap those described above in the semiconductor package 300A according to the exemplary embodiment, and a description thereof is thus omitted.

Figure 13:
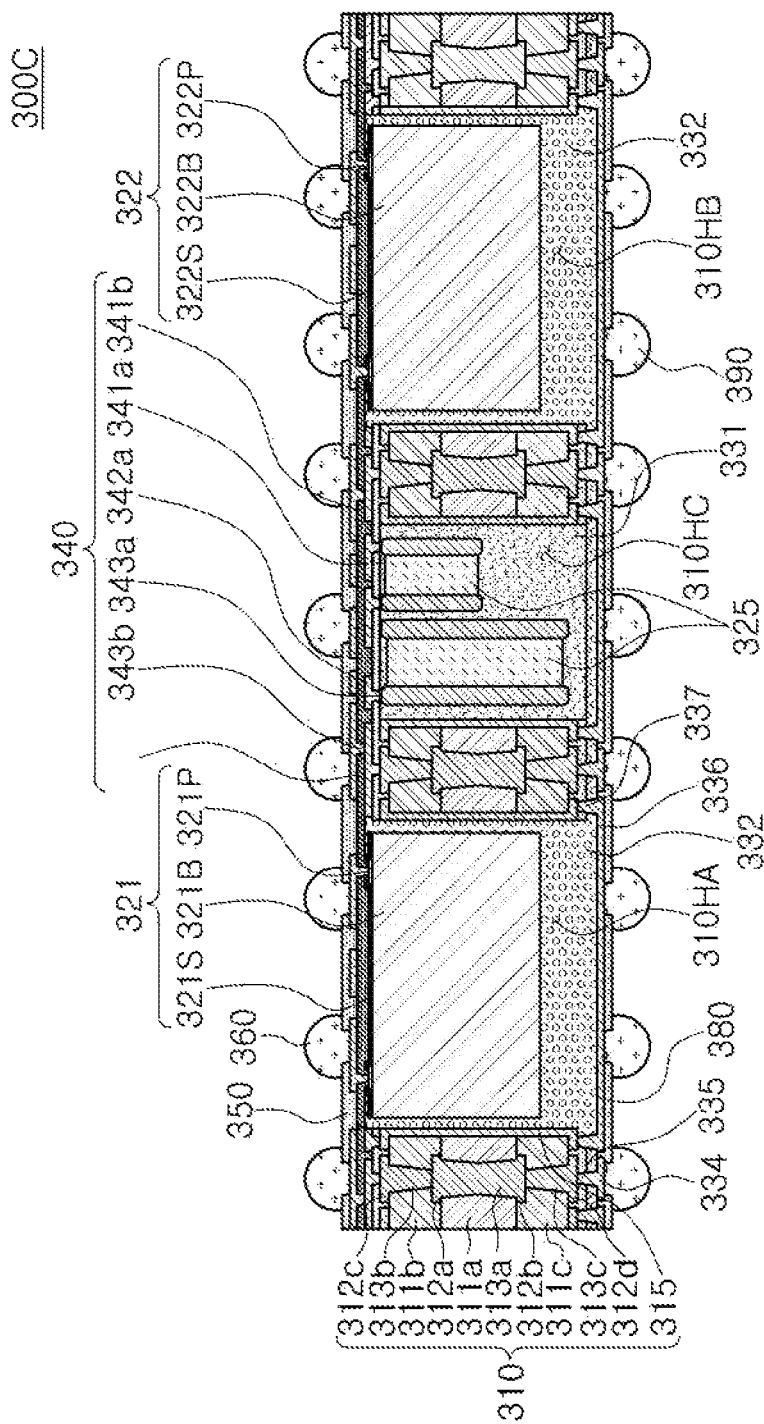
FIG. 13 is a schematic cross-sectional view illustrating a semiconductor package according to another exemplary embodiment used in the antenna module.

FIG. 13 is a schematic cross-sectional view illustrating a semiconductor package according to another exemplary embodiment used in the antenna module.

Referring to FIG. 13, in a semiconductor package 300C, a frame 310 may include a first insulating layer 311a, a first wiring layer 312a and a second wiring layer 312b disposed on upper and lower surfaces of the first insulating layer 311a, respectively, a second insulating layer 311b disposed on the upper surface of the first insulating layer 311a and covering the first wiring layer 312a, a third wiring layer 312c disposed on an upper surface of the second insulating layer 311b, a third insulating layer 311c disposed on the lower surface of the first insulating layer 311a and covering the second wiring layer 312b, and a fourth wiring layer 312d disposed on a lower surface of the third insulating layer 311c. Since the frame 310 may include a large number of wiring layers 312a, 312b, 312c, and 312d, a connection structure 340 may further be simplified. Therefore, a decrease in a yield depending on a defect occurring in a process of forming the connection structure 340 may be suppressed. Meanwhile, the first to fourth wiring layers 312a, 312b, 312c, and 312d may be electrically connected to each other through first to third connection vias 313a, 313b, and 313c each penetrating through the first to third insulating layers 311a, 311b, and 311c.

A material of each of the insulating layers 311a, 311b, and 311c is not particularly limited. For example, an insulating material may be used as the material of each of the insulating layers 311a, 311b, and 311c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The first insulating layer 311a may have a thickness greater than those of the second insulating layer 311b and the third insulating layer 311c. The first insulating layer 311a may be basically relatively thick in order to maintain rigidity, and the second insulating layer 311b and the third insulating layer 311c may be introduced in order to form a larger number of wiring layers 312c and 312d. The first insulating layer 311a may include an insulating material different from those of the second insulating layer 311b and the third insulating layer 311c. For example, the first insulating layer 311a may be, for example, prepreg including a core material, a filler, and an insulating resin, and the second insulating layer 311b and the third insulating layer 311c may be an ABF or a PID film including a filler and an insulating resin. However, the materials of the first insulating layer 311a and the second and third insulating layers 311b and 311c are not limited thereto.

The wiring layers 312a, 312b, 312c, and 312d may serve to redistribute connection pads 321P and 322P of semiconductor chips 321 and 322. A material of each of the wiring layers 312a, 312b, 312c, and 312d may be a conductive material such as copper (Cu), aluminum (Al), silver (Ag), tin (Sn), gold (Au), nickel (Ni), lead (Pb), titanium (Ti), or alloys thereof. The wiring layers 312a, 312b, 312c, and 312d may perform various functions depending on designs of corresponding layers. For example, the wiring layers 312a, 312b, 312c, and 312d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 312a, 312b, 312c, and 312d may include signal via pads, ground via pads, and the like. In addition, the wiring layers 312a, 312b, 312c, and 312d may include feeding patterns.

The first wiring layer 312a and the second wiring layer 312b may be disposed on a level between an active surface and an inactive surface of each of the semiconductor chips 321 and 322. Thicknesses of the wiring layers 312a, 312b, 312c, and 312d of the frame 310 may be greater than those of redistribution layers 342 of the connection structure 340.

The connection vias 313a, 313b, and 313c may electrically connect the wiring layers 312a, 312b, 312c, and 312d formed on different layers to each other, resulting in an electrical path in the frame 310. A material of each of the connection vias 313a, 313b, and 313c may be a conductive material. Each of the connection vias 313a, 313b, and 313c may be completely filled with the conductive material, or the conductive material may also be formed along a wall of each of via holes. The first connection vias 313a may have a hourglass shape or a cylindrical shape, and the second and third connection vias 313b and 313c may have tapered shapes of which directions are opposite to each other. The first connection vias 313a penetrating through the first insulating layer 311a may have a diameter greater than those of the second and third connection vias 313b and 313c respectively penetrating through the second and third insulating layer 311b and 311c.

Other configurations overlap those described above in the semiconductor package 300A according to the exemplary embodiment, and a description thereof is thus omitted.

As set forth above, according to an exemplary embodiment in the present disclosure, an antenna module of which a size may be reduced, in which loss of an RF signal may be significantly reduced by reducing a length of a signal line in spite of the reduction in the size of the antenna module, and of which a height may also be reduced may be provided.

While exemplary embodiments have been shown and described above, it will be apparent to those skilled in the art that modifications and variations could be made without departing from the scope of the present invention as defined by the appended claims.

What is claimed is:

1. An antenna module comprising:
a base substrate including a flexible core layer having a first side and a second side opposing the first side, a first substrate on the first side at a proximal end of the flexible core layer and a second substrate on the second side at the proximal end of the flexible core layer, wherein the first substrate, the second substrate, and a portion of the flexible core layer between the first substrate and the second substrate form a rigid region and a remaining portion of the flexible core layer at a distal end thereof form a flexible region which is more flexible than the rigid region;
an antenna member disposed on a first surface of the rigid region of the base substrate and including antenna patterns; and
a semiconductor package disposed on a second surface of the rigid region of the base substrate opposite to the first surface and including one or more semiconductor chips.

2. The antenna module of claim 1, wherein the antenna member is an antenna substrate, and
the antenna substrate is mounted on the first surface of the rigid region of the base substrate through an electrical connection structure disposed between the antenna substrate and the rigid region of the base substrate.

3. The antenna module of claim 1, wherein the antenna member is integrated with the base substrate.

4. The antenna module of claim 3, wherein the antenna member is built-up on the first surface of the rigid region of the base substrate.

5. The antenna module of claim 1, wherein the semiconductor package is disposed below the antenna member in a stacking direction of the semiconductor package, the base substrate, and the antenna member.

6. The antenna module of claim 5, wherein the semiconductor package and the antenna member overlap with each other in the stacking direction.

7. The antenna module of claim 1, wherein a thickness of the rigid region is greater than a thickness of the flexible region.

8. The antenna module of claim 1, wherein the semiconductor package includes a radio frequency integrated circuit (RFIC) and a power management integrated circuit (PMIC) as the semiconductor chips.

9. The antenna module of claim 8, wherein the semiconductor package further includes a passive component.

10. The antenna module of claim 9, wherein the passive component includes at least one of a capacitor and an inductor.

11. An antenna module comprising:
a base substrate including a rigid region and a flexible region which is more flexible than the rigid region;
an antenna member disposed on a first surface of the rigid region of the base substrate and including antenna patterns;
a semiconductor package disposed on a second surface of the rigid region of the base substrate opposite to the first surface and including one or more semiconductor chips; and
a connector disposed on an end portion of the flexible region of the base substrate.

12. An antenna module comprising:
a base substrate including a rigid region and a flexible region which is more flexible than the rigid region;
an antenna member disposed on a first surface of the rigid region of the base substrate and including antenna patterns; and
a semiconductor package disposed on a second surface of the rigid region of the base substrate opposite to the first surface and including one or more semiconductor chips,
wherein the semiconductor package includes a frame having a first through-hole, a first semiconductor chip disposed in the first through-hole and having a first active surface having first connection pads disposed thereon and a first inactive surface opposing the first active surface, an encapsulant covering at least portions of each of the frame and the first inactive surface of the first semiconductor chip and filling at least portions of the first through-hole, and a connection structure disposed on the frame and the first active surface of the first semiconductor chip and including redistribution layers electrically connected to the first connection pads, and
the first semiconductor chip is an RFIC.

13. The antenna module of claim 12, wherein the frame further has a second through-hole spaced apart from the first through-hole and a third through-hole spaced apart from the first and second through-holes,
a second semiconductor chip is disposed in the second through-hole, the second semiconductor chip having a second active surface having second connection pads disposed thereon and a second inactive surface opposing the second active surface,
a passive component is disposed in the third through-hole,
the second semiconductor chip is a PMIC, and
the passive component is at least one of a capacitor and an inductor.

14. The antenna module of claim 13, wherein the encapsulant includes a first encapsulant covering at least portions of each of the frame and the passive component and filling at least portions of the third through-hole and a second encapsulant covering at least portions of each of the first encapsulant and the first and second semiconductor chips and filling at least portions of each of the first and second through-holes.

15. The antenna module of claim 13, wherein the passive component is connected to a first redistribution layer of the redistribution layers of the connection structure through first connection vias of the connection structure,
the first and second connection pads are connected to a second redistribution layer of the redistribution layers of the connection structure through second connection vias of the connection structure, and
the first and second redistribution layers are disposed on different levels.

16. The antenna module of claim 13, wherein the frame includes a metal layer disposed on walls of the first to third through-holes and extending to a lower surface of the frame, and
the semiconductor package further includes a backside metal layer disposed on a lower surface of the encapsulant and backside metal vias penetrating through the encapsulant and connecting the backside metal layer to the metal layer of the frame.

17. The antenna module of claim 12, wherein the frame includes an insulating layer, a first wiring layer disposed on an upper surface of the insulating layer, a second wiring layer disposed on a lower surface of the insulating layer, and connection vias penetrating through the insulating layer and electrically connecting the first and second wiring layers to each other.

18. The antenna module of claim 17, wherein the semiconductor package further includes a backside wiring layer disposed on a lower surface of the encapsulant and backside connection vias penetrating through the encapsulant and connecting the backside wiring layer to the second wiring layer of the frame.

19. The antenna module of claim 12, wherein the frame includes a first insulating layer, a first wiring layer disposed on an upper surface of the first insulating layer, a second wiring layer disposed on a lower surface of the first insulating layer, a second insulating layer disposed on the upper surface of the first insulating layer and covering the first wiring layer, a third wiring layer disposed on an upper surface of the second insulating layer, a third insulating layer disposed on the lower surface of the first insulating layer and covering the second wiring layer, a fourth wiring layer disposed on a lower surface of the third insulating layer, first connection vias penetrating through the first insulating layer and electrically connecting the first and second wiring layers to each other, second connection vias penetrating through the second insulating layer and electrically connecting the first and third wiring layers to each other, and third connection vias penetrating through the third insulating layer and electrically connecting the second and fourth wiring layers to each other.

20. The antenna module of claim 12, wherein the frame includes a first insulating layer, a first wiring layer embedded in an upper side of the first insulating layer so that an upper surface thereof is exposed, a second wiring layer disposed on a lower surface of the first insulating layer, a second insulating layer disposed on the lower surface of the first insulating layer and covering the second wiring layer, a third wiring layer disposed on a lower surface of the second insulating layer, first connection vias penetrating through the first insulating layer and electrically connecting the first and second wiring layers to each other, and second connection vias penetrating through the second insulating layer and electrically connecting the second and third wiring layers to each other.

* * * * *